(12) United States Patent
Nattermann et al.

(10) Patent No.: US 8,420,218 B2
(45) Date of Patent: Apr. 16, 2013

(54) PHOTOVOLTAIC MODULES HAVING REDUCED WEIGHT

(75) Inventors: Kurt Nattermann, Ockenheim (DE);
Ingo Schwirtlich, Miltenberg (DE);
Uwe Fliedner, Kleinostheim (DE);
Harry Engelmann, Ingelheim (DE)

(73) Assignee: Schott AG, Mainz (DE)

( * ) Notice: Subject to any disclaimer, the term of this patent is extended or adjusted under 35 U.S.C. 154(b) by 565 days.

(21) Appl. No.: 12/756,252

(22) Filed: Apr. 8, 2010

(65) Prior Publication Data

US 2010/0258183 A1 Oct. 14, 2010

(30) Foreign Application Priority Data

Apr. 9, 2009 (DE) .......................... 10 2009 016 735

(51) Int. Cl.
*H01L 31/0203* (2006.01)
*H01L 31/0236* (2006.01)

(52) U.S. Cl.
USPC ........... 428/426; 428/212; 428/216; 428/156; 428/172; 428/174; 136/251; 136/256; 136/259

(58) Field of Classification Search ........................ None
See application file for complete search history.

(56) References Cited

U.S. PATENT DOCUMENTS

| | | | | |
|---|---|---|---|---|
| 4,239,555 | A | * 12/1980 | Scharlack et al. | ............ 136/251 |
| 6,262,358 | B1 | 7/2001 | Kamimura et al. | |
| 2006/0272699 | A1 | 12/2006 | Lauvray et al. | |
| 2008/0156365 | A1* | 7/2008 | Scholz et al. | ................. 136/251 |
| 2008/0169022 | A1* | 7/2008 | Matsui et al. | ................. 136/256 |
| 2009/0283136 | A1 | 11/2009 | Muench et al. | |
| 2010/0051093 | A1 | 3/2010 | Harder et al. | |
| 2012/0017975 | A1* | 1/2012 | Giron et al. | ................... 136/252 |

FOREIGN PATENT DOCUMENTS

| | | |
|---|---|---|
| DE | 94 21 390 | 10/1995 |
| DE | 10 2005 030 039 | 1/2007 |
| DE | 10 2005 057 468 | 5/2007 |
| EP | 0 343 419 | 11/1989 |
| EP | 1 798 775 | 6/2007 |

* cited by examiner

*Primary Examiner* — David Sample
(74) *Attorney, Agent, or Firm* — Michael J. Striker

(57) ABSTRACT

The construction principles according to the present invention make possible large sheet-like solar modules with low weight, which have great mechanical toughness, are inured to rough climatic environment influences and withstand thermal stress due to solar irradiation and shadowing effects. The solar modules have front and back panes, one of which has a thickness of at least 3 mm and the other of which has a thickness of at most 2 mm. The coefficient of thermal expansion of the thicker pane is preferably greater than that of the thinner pane. In preferred embodiments burling or a wavy structure is provided on one side of the front pane and/or the back pane.

13 Claims, 3 Drawing Sheets

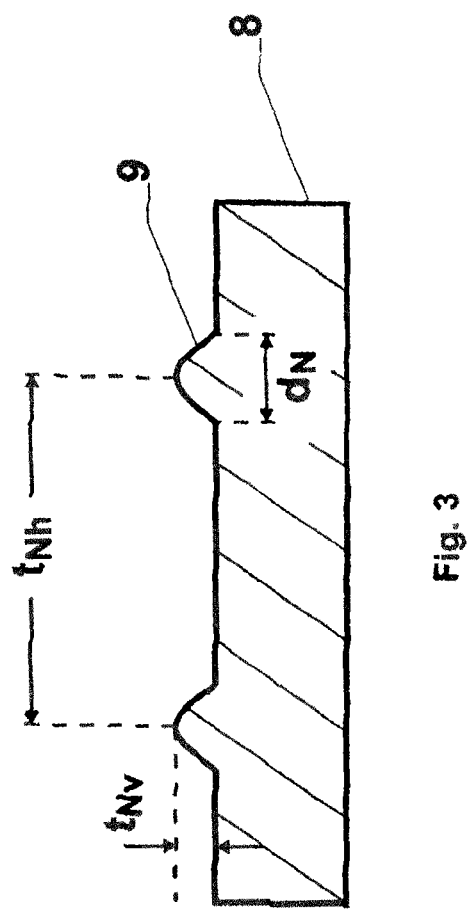

PHOTOVOLTAIC MODULES HAVING REDUCED WEIGHT

CROSS-REFERENCE

The invention described and claimed herein below is also described in German Patent Application DE 10 2009 016 735.8, filed on Apr. 9, 2010 in Germany. The aforesaid German Patent Application, whose subject matter is incorporated herein by reference thereto, provides the basis for a claim of priority of invention for the invention claimed herein below under 35 U.S.C. 119 (a)-(d).

BACKGROUND OF THE INVENTION

The present invention relates to solar modules having low weight which have high stability due to the special configuration of its front and back panes. Preferable panes are glass panes and in the following the term "pane" also includes a glass pane.

Normally, solar modules have a design according to FIG. 1. Thus, solar modules normally comprise a front pane 2, a back pane 3 and an intermediate layer 4. As shown in FIG. 2, the intermediate layer often consists of embedment material layers 5 and 6 as well as solar cells 7. The embedment material layers 5 and 6 themselves can be laminates so that they consist of several single layers.

Basically, the solar modules according to the present invention have a similar design. But they are characterized by a special configuration of the front pane and the back pane.

With the special configuration of the front pane and the back pane according to the present invention solar modules are provided which have improved stability and reduced weight in comparison to prior art solar modules. In this way it is possible to provide larger modules having nevertheless a weight which can be handled.

Solar cells for direct conversion of solar energy into electric current have to be encapsulated for mechanical protection e.g. against hail, damages during the installation or service and corrosive environmental influences as well as for achieving the required electrical safety. The essential components of the encapsulation are an optically transparent front pane, embedment materials into which the solar cells are laminated or cast and which are transparent at least between the front pane and the solar cells, and a back foil on the back side of the solar module. The composite consisting of a front pane, embedment materials, solar cells, integrated components, a back foil and a back pane as well as optionally a frame is referred to as a solar module.

Front panes normally consist of natron silicate glasses having a thickness of greater than 3 mm so that they can be thermally pre-tensioned. In rolled front panes structures can be rolled in or embossed on the outer side surface to prevent vectored reflection of light or to increase the coupling-in efficiency for the solar radiation. It is possible to coat the outer surface for improving the coupling in of radiation.

As embedment materials polymer materials, such as e.g. EVA (ethylene vinyl acetate) which is relatively inexpensive and has well known properties, can be used. Normally, the embedment materials are used in the form of foils having thicknesses of between 0.4 and 0.8 mm.

The solar cells can be panels of polycrystalline silicon having thicknesses of between 0.1 and 0.4 mm. Solar cells can also be directly applied onto the front pane. This is normally realized with a transparent and electrically conductive intermediate layer. In some embodiments of thin layer modules solar cells are embedded in the module on separate carrier panels e.g. of electrically conductive metal sheets. In the mechanical realization of the solar modules then the carrier panel with the solar cells replaces the real solar cells.

Many back foils are known, such as TPT® (TEDLAR®-PET-TEDLAR®, TEDLAR® polyvinyl fluoride) and TAP® laminates (TEDLAR® aluminium PET) having normal thicknesses of 0.3 mm to 0.8 mm. For the back side also metal plates or glass panes can be used. The latter are referred to as double glass modules. For that also lime natron silicate glasses are used which normally have thicknesses of higher than 3 mm so that they can be thermally pre-tensioned. Normally, double glass modules have a symmetric design, i.e. the thicknesses of the front pane and the back pane are similar.

At least one of both panes (front pane or back pane) has the function of a carrier. In the case of double glass modules both panes have a carrier function. In this case, both panes absorb the loads, which are caused by their own weight, and by wind, ice and snow, and they transmit them through the frame, clamps at the edges or the like to the substructure of the solar modules.

Solar modules for terrestrial use have to be designed for a temperature range of −40 to 85° C. Since solar modules are normally assembled by laminating at temperatures of up to 150° C., the temperature range in which a solar module has to "survive" is −40 to 150° C. In this case, the load is caused by different coefficients of thermal expansion a of module components. As reference values the following values can be used.

Natron silicate glasses which are normally used for front and back panes have a values in the range of $8*10^{-6}$ to $10*10^{-6} K^{-1}$.

Back foils of polymeric materials (e.g. TPT®) have $\alpha$ values in the range of $50*10^{-6}$ to $150*10^{-6} K^{-1}$, wherein these values strongly depend on the temperature in a non-linear manner and may change in the course of time.

In the case of back foils of polymeric metal composites (e.g. TAP®) the metal layer has a strong influence on the coefficient of thermal expansion of the whole composite due to its relatively high modulus of elasticity. TAP® has an $\alpha$ value of about $13*10^{-6} K^{-1}$ to $18*10^{-6} K^{-1}$.

For embedment materials of polymers the $\alpha$ values are in the range of $50*10^{-6}$ to $200*10^{-6} K^{-1}$, wherein these values depend on the temperature in a non-linear manner and may change in the course of time.

The layer with the solar cells, e.g. of crystalline Si panels has an average coefficient of expansion of about $4*10^{-6} K^{-1}$.

The thermal expansion of cells for thin layer modules in which the cells are directly applied onto the front or back pane can be neglected. If the cells are applied onto separate carrier panels, the mean coefficient of expansion of the carrier panels is used. The "mean coefficient of expansion" means the coefficient of expansion which is the result of the determination of the average of the coefficients of expansion of the materials in the plane of the solar module in consideration of their relative proportions of length.

In the case of temperature changes mechanical stress in the solar module can be caused by different coefficients of expansion of the solar module components and the solar modules may be deformed. A strong deformation may e.g. lead to high mechanical loads in prefabricated building members and roof structures.

In the past many attempts have been made to provide solar modules with constant stability but with reduced weight. E.g. EP 1 798 775 A2 describes solar modules with front and/or back panes of borosilicate glass. In the relevant temperature range common borosilicate glasses have coefficients of thermal expansion of 3.3 to $6*10^{-6}$ $K^{-1}$ and thus are better adjusted to the coefficient of expansion of the silicon solar cells (ca. $2.6*10^{-6}$ $K^{-1}$) than natron silicate glasses. This may reduce thermo-mechanical stress in the solar modules but does not reduce the weight of the solar modules themselves.

In the case of double glass modules it is known that thermo-mechanical loads can be reduced by a symmetric design: front and back panes are of the same glass (the same coefficient of expansion) and have nearly the same thicknesses. This prevents the "bimetal effect" during temperature changes with strong warping of the panes which leads to high bending stress in the module components and to high mechanical loads in the prefabricated building members or roof structures.

In the case of back foil modules normally thermo-mechanical loads are compensated by the use of viscoelastic or viscoplastic creep ability which is inherent to the embedment materials and the back foil. If the temperature changes are not too fast, a relaxation of the mechanical stress in the embedment materials and foils takes place so that the thermal elongation and shrinkage of these materials only leads to low mechanical stress.

In the case of back foil modules with metal interlayers in the back foils (e.g. TAP®) normally the metal layers are thin enough that the thermo-mechanical elongations do not result in appreciable forces exerted onto the solar module. In the case of strong temperature changes back foils may form convolutions with high creep ability of the embedment materials which are below the foils. But normally they do not result in appreciable mechanical loads of the solar modules.

Typical dimensions of solar modules are $1.1*1.3$ $m^2$. Larger modules are preferable, because they have lower production costs, storage costs, transport costs, fewer necessary prefabricated building members and necessary electric circuits. Modules having dimensions of $2.2*2.6$ $m^2$ are already under way. Large modules whose weight has not been reduced will cause the following problems.

The handling of large modules is laborious due to their bulkiness and high weight. Normally, solar modules are installed manually. Since the bulkiness is a result of the weight of solar modules, there exists the desire for reducing weight so that also large modules can be carried by one or two persons.

A high weight of single modules makes great demands on the prefabricated building members and roof structures.

Large modules have to tolerate a higher load by their own weight.

Large modules have to tolerate a higher load due to wind, hail and snow loads.

The solar modules are deformed by wind and snow loads in an elastic or plastic manner or mechanical stress is caused in the module components in particular in the faces, edges and optional passages in the front and back panes.

At best the solar module has elastic or viscoelastic properties. To assess the bending of a solar module caused by wind, snow and its own weight, the module can approximately be considered as a Kirchhoff plate. For a Kirchhoff plate onto which a homogenous pressure is applied to the whole face (test conditions according to standard EN 61215) the bending is defined as $$W \propto L^4/t^3,$$

wherein w is the rising height of the bending (e.g. the distance from the highest point on the upper side of the front pane to the lowest point), L is a representative length of an edge of the solar module or its diagonal or the diameter in the case of circular modules and t is the thickness of the module. When the maximum bending of the modules is limited, the necessary thickness $t_{erf}$ and the weight G of the solar module are defined with respect to the module size:

$$t_{erf} \propto L^{1.33}$$

$$G \propto L^{3.33}$$

I.e., the necessary thickness of a solar module and its weight increase disproportionately to its lateral dimensions. An assessment for that: in the case of a solar module having dimensions of $1.1 \times 1.3$ $m^2$ a glass pane having a thickness of 3 mm can be used for the front pane, but for a module having dimensions of $2.2 \times 2.6$ $m^2$ a thickness of the glass pane of at least 7.5 mm would be necessary to limit its bending. In this case the weight of the module would increase by a factor of 10. The handling of modules with such a high weight would be very difficult.

The unexamined and first publication DE 10 2005 057 468 A1 describes a solar module which is adhered to a light-weight structure strengthened by support frames for reinforcement. This proposal has several disadvantages: With temperature changes in the adhesion areas between the solar modules and the light-weight structure high shear and normal stress are caused which in the course of time may lead to a breakdown of the composite. The light-weight structure is bulky and weighty. In addition, it requires special substructures.

The unexamined and first publication DE 10 2005 030 039 A1 describes a substructure for fixing solar modules on flat roofs. In this case the forces exerted onto the roofs by wind loads at the modules are reduced by wind baffle plates and wind deflectors. But this solution cannot be used in the case of snow loads. In addition, there is the object to provide large-scale solar modules which can withstand high wind loads.

There is a high demand for large solar modules having low weight.

SUMMARY OF THE INVENTION

It is the object of the present invention to provide large sheet-like solar modules having low weight which have high mechanical toughness, are inured to rough climatic environmental influences and withstand the thermal load through solar irradiation and shadowing effects.

The object is solved by the subject matter of the patent claims.

It has surprisingly been found that a solar module having sufficient bearing strength, high thermal stability and low weight can be provided when the front pane and the back pane have different thicknesses.

The solar module according to the present invention has at least one front pane and one back pane, wherein one of both panes has a higher thickness than the other pane, wherein one pane has a thickness of at least 3 mm±8% and the other pane has a thickness of at most 2 mm±8%. Preferably, both panes have different coefficients of thermal expansion.

Further, the solar modules according to the present invention have an intermediate layer. Preferably, the intermediate layer consists of embedment material layers and solar cells. Preferably, the embedment material layers may be laminates themselves, i.e. they may consist of several single layers. Preferably, the embedment material layers comprise EVA (ethylene vinyl acetate). EVA is inexpensive and has well-known properties. Preferably, the embedment materials are foils having thicknesses of between 0.4 and 0.8 mm.

Preferably, the solar cells are panels of polycrystalline silicon having thicknesses of between 0.1 and 0.4 mm.

In an alternative embodiment of the present invention the intermediate layer of the solar module consists of the solar cells, i.e. no embedment material layers are used. Normally, in this case a transparent and electrically conductive intermediate layer is used. In this case it is particularly preferable according to the present invention that the thickness of the thinner pane is at least 0.7 mm and as a precaution it is even more preferable that this thickness is higher than 0.9 mm to protect the solar cells from impact loads in a sufficient amount.

In the production of panes, in particular glass panes, variations of the thickness appear which have technical reasons. Empirically they are within the range of ±8% around the reference value. The term "variations of the thickness" means that several panes with a common reference value for their thickness have different thicknesses or sizes. The solar modules according to the present invention comprise panes which are preferably produced according to a float process.

Thus, also such embodiments in which the thickness of the thicker pane each varies in a range of ±8% around the reference value are comprised by the present invention. Preferably, the variations of the thickness are only 7%, further preferably 5%, more preferably 4% and most preferably 3%.

A variation of the thickness of 8% around the reference value leads to a thickness of the achieved panes of between 2.76 and 3.24 mm due to production conditions, with an intended thickness of a batch of front panes having a reference value of 3 mm.

Preferable are those glasses from which the different panes of the solar modules according to the present invention are produced, selected from the group consisting of natron silicate glasses, borosilicate glasses and lithium aluminium silicate glasses. According to the present invention it is preferable that the thicker pane is manufactured from natron silicate glass. Preferably, this is in particular the case, when the thicker pane is the back pane of the solar module. In particular the thicker pane of the solar module is preferably produced by the float process. Preferably, the thinner pane is manufactured from glasses of the family of borosilicate glasses or lithium aluminium silicate glasses. Preferably, this is in particular the case, when the thinner pane is the front pane of the solar module. Preferably, this thinner pane is produced by the rolling process.

In a particular preferable embodiment of the present invention both panes, the front pane and the back pane, are manufactured from lime natron silicate glass. In another preferable embodiment of the invention both panes, the front pane and the back pane, are manufactured from borosilicate glasses.

One of both panes has a thickness which is sufficiently high to give the solar module a significant amount of its bearing strength. Nevertheless, the other pane is thin but can effectively protect the encapsulated solar cells and can provide a contribution to the bearing strength. Preferably, the thickness of the thicker pane is higher than 3.5 mm to increase its bearing strength. This embodiment is particularly preferable, when the longer edge of the solar module is longer than 1.5 m which is preferable according to the present invention.

In particular in the case of solar modules having a length of the longer edge of—further preferable according to the present invention—more than 2 m it is preferable to choose a thickness of the thicker pane of 4 mm or higher, since this reduces the shortening of the pane composite in the module plane by pressure or suction loads. Thus, the required engagement of the composite in the module frame is reduced and the area of the solar module which is effective for photovoltaic use is increased.

If modules having a length of the longer edge of lower than 3 m are used it is not necessary that the thicker pane has a thickness that exceeds 6 mm. According to the present invention it is preferable that in this case and when the thicker pane is thermally pre-tensioned a thickness of lower than 5 mm is sufficient. Due to its weight reduction, this embodiment is preferable.

According to the present invention it is further preferable that the thinner pane has a thickness of lower than 1.5 mm so that the weight can be reduced in addition. If the thickness of the intermediate layer is higher than 0.8 mm, the thickness of the thinner pane may preferably be lower than 1.2 mm. Therefore, this embodiment with a still lower weight is more preferable. Preferably, the thinner pane has a thickness of at least 0.3 mm to protect the solar cells from influences from outside. Preferably, the thinner pane has a thickness of at least 0.5 mm to have an optimum resistance against impact and dent. According to the present invention a thickness of higher than 0.7 mm is preferable so that the panes can be handled with established devices during the production process. A preferably high resistance can be achieved with a thickness of the thinner pane of higher than 0.9 mm.

According to the present invention it is preferable that the thinner pane is the front pane of the solar module, because in this case the required optical transmittances can be achieved more easily. Furthermore, the costs for e.g. mixtures with particularly low levels of iron for highly transparent glasses can be reduced.

It is preferable that the solar module according to the present invention has a thicker pane which has a greater linear coefficient of thermal expansion than the thinner pane. Surprisingly the positive effects according to the present invention are nearly independent of the properties of the embedment materials. Furthermore, for the effect according to the present invention the precise coefficients of expansion of the involved panes are not important but importance is attached to the difference of the coefficients of expansion.

Therefore it is preferable that the coefficient of thermal expansion of the thicker pane is at least $3 \cdot 10^{-6}$ $K^{-1}$ greater than that of the thinner pane, because then the thermal buckling ("bimetal effect") of the composite in the case of temperature shocks of the whole composite (e.g. in the case of a heavy shower) is small. In a further preferable embodiment the coefficient of expansion of the thicker pane is at least $4 \cdot 10^{-6}$ $K^{-1}$ greater than that of the thinner pane, since this further improves the durability of the composite in the case of vertical temperature gradients. When the coefficient of expansion of the thicker pane is more than $4.5 \cdot 10^{-6}$ $K^{-1}$ greater than that of the thinner pane, even an improvement of the durability of the composite in the case of horizontal temperature gradients due to cast shadows can be seen. Thus, this embodiment is more preferable.

Especially in the case of thin panes there is the problem that thermal pre-tensioning can only be conducted in a poor manner or even not at all (at thicknesses of lower than 1.2 mm) and chemical pre-tensioning is no alternative due to high costs. Here a special embodiment of the present invention is useful.

In a preferred embodiment according to the present invention the surfaces of the solar module have burling. I.e. on the surface conical bumps or peaks with blunt tips in an arrangement which is as regular as possible are produced e.g. by rolling in at the glass pull. FIG. 3 shows the principle of the burling. In one pane which can be the front pane or the back pane burling having nearly uniform height $t_{Nv}$, diameter of the base $d_N$ and distance or spacing $t_{Nh}$ is produced on at least one surface.

According to the present invention it is preferable that the burling height $t_{Nv}$ is at least 0.03 mm to achieve the effect of increasing strength. The burling height is preferably at least 0.10 mm so that the burling cannot be abraded in an abrasive environment (e.g. during storage, handling, use) in an easy way. However, the height of the burling should preferably be lower than 0.5 mm to increase its resistance against fracture and to achieve the blunt form of the burling tip in an easier way. Preferably the burling height is higher than 0.12 mm and lower than 0.22 mm so that it can be rolled in into the glass surface during the production of the panes with sufficient process stability. In addition, in glass panes having a thickness of lower than 1.5 mm burling with a height of higher than 0.2 mm can only be rolled in or embossed with much time and effort.

The burling may be e.g. in a rectangular or hexagonal arrangement. Hexagonal arrangement is preferable so that the glass surface in the space between the burling cannot be scratched completely.

Instead of the burling distance it is better to use the term burling density $\Sigma_N$ (amount of burling per unit area). The burling density $\Sigma_N$ should be at least 4 cm$^{-2}$, so that the effect of increasing strength occurs. Preferably the burling density is higher than 10 cm$^{-2}$, because such a density further reduces the probability of scratching of the pane surface in the space between the burling.

According to the present invention it is preferable that the strength of the thinner pane is increased by burling. Preferably the pane having burling carries the burling on the outer side. It is particularly preferable that the pane having burling carries burling on both sides, because this improves the impact strength of the pane.

A further special embodiment of the present invention is the wavy structure of the panes. In this case the glass panes as a whole are shaped e.g. by means of a shaped pair of rolls at the glass pull. FIG. 4 shows the principle. A pane which may be front pane or back pane has wavelike heights and depressions with a rising height $t_{pv}$ (difference of the highest to the lowest position measured on one side of the pane) and a wave length $t_W$. In this case the thickness of the pane is substantially without variation.

The rising height $t_W$ should be at least 0.3 mm so that the effect of increasing strength occurs. Preferably, the rising height is at least 1 mm, because this results in the desired stiffening of the pane. Preferably, the rising height should be lower than 1 cm, because otherwise the solar module would become too thick. Preferably, the rising height is lower than 3 mm to limit the amount of the required embedment material.

The wavy structure may be e.g. a rectangular or hexagonal structure. Hexagonal structure is preferable, because this increases the flexural rigidity of the pane. According to the present invention it is preferable that the following ratio defines the wavy structure: $t_W \geq 12\, t_{pv}$. When this ratio is fulfilled then the flanks of the waves are so flat that in the case of contact or impact load the impactor normally slides away without damage of the glass surface.

Primarily the wavy structure is useful for increasing the strength of the thinner pane. According to the present invention for glass panes having wavy structure as pane thickness the defined mean thickness is used which is defined by the following equation:

$$\bar{t} = \sqrt[3]{t^3 + 0.15 \cdot z^3} \quad \text{with } z = \min(t, t_{pv}),$$

wherein t is the nominal thickness of the pane, i.e. the thickness measured at a suitable site in the center area of the pane, and $t_{pv}$ is the rising height of the wavy structure.

In a particularly preferable embodiment according to the present invention the pane having wavy structure also carries burling. For glass panes having wavy structure and burling as the pane thickness of the design of the solar module the defined mean thickness is used which is defined as follows:

$$\bar{t} = \sqrt[3]{\bar{t}^3 + 0.15 \cdot z^3} \quad \text{with } z = \min(\bar{t}, t_{pv}),$$

wherein $\bar{t}$ is the mean thickness of the pane resulting from the surface structure.

BRIEF DESCRIPTION OF THE DRAWING

The objects, features and advantages of the invention will now be illustrated in more detail with the aid of the following description of the preferred embodiments, with reference to the accompanying figures in which:

FIGS. 3 and 4 are diagrammatic cross-sectional views through showing the burling and wavy structure respectively of the front or back pane of a solar module.

DESCRIPTION OF THE PREFERRED EMBODIMENTS

Figure 1:
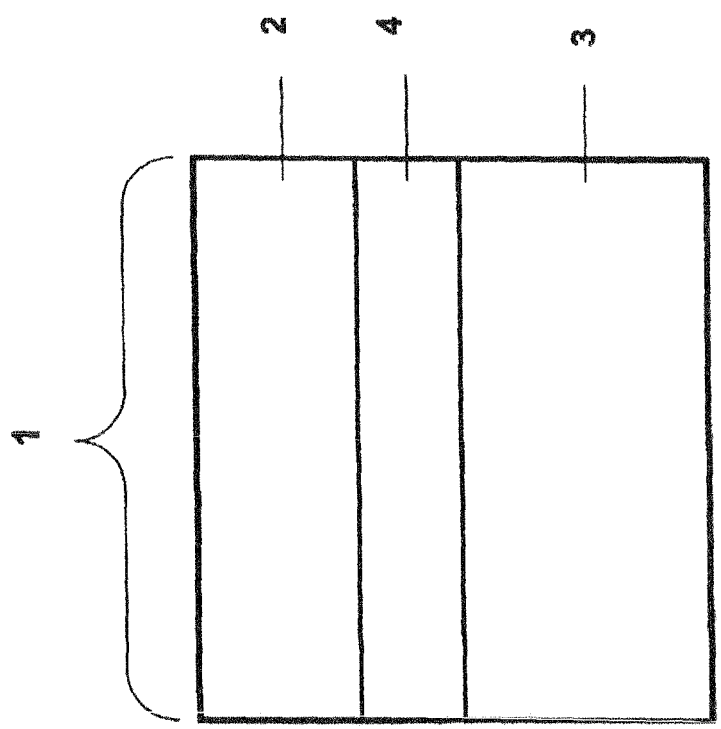

Solar modules normally have a design according to FIG. 1. The structure of the solar modules normally includes a front pane 2, a back pane 3 and an intermediate layer 4.

Figure 2:
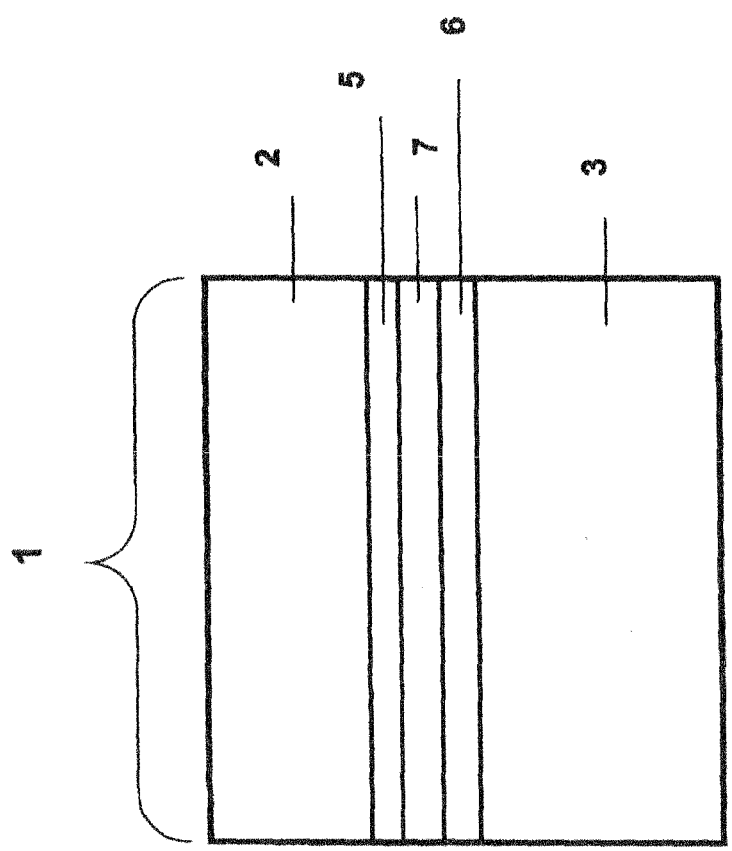
FIGS. 1 and 2 are respective plan views of conventional designs for solar modules showing the structure of the layers in the modules.

Further details of the structure of the solar modules are apparent from FIG. 2. The intermediate layer 5, 6, 7 in FIG. 2 often consists of embedment material layers 5 and 6 as well as the solar cells 7. Each of the embedment material layers 5 and 6 may be a laminate, i.e. they may each consist of several individual layers.

FIG. 3 illustrates the principle of burling. In a pane 8, which may be a front pane or a back pane, burling 9 having nearly uniform height $t_{Nv}$, diameter of the base $d_N$ and distance or spacing $t_{Nh}$ is produced at least on one surface.

Figure 4:
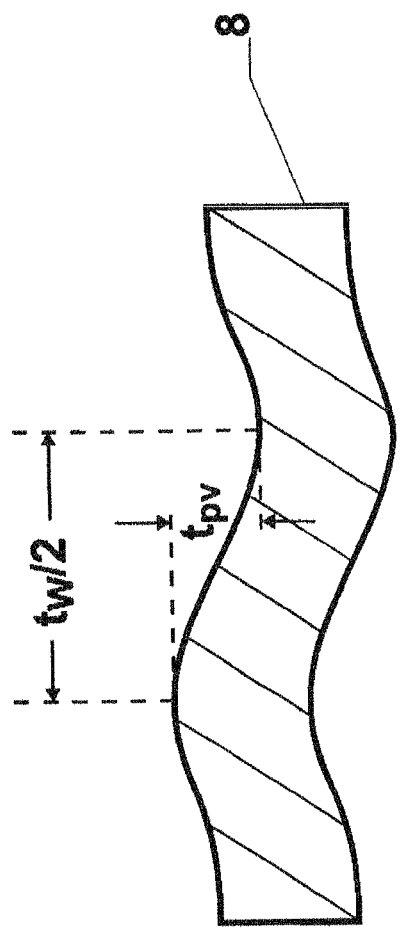

FIG. 4 illustrates the wavy structure. A pane 8, which may be the front pane or the back pane, has wavelike heights and depressions with a rising height $t_{pv}$ (difference of the highest to the lowest position measured on one side of the pane) and a wave length $t_W$. In this case the thickness of the pane is substantially without variation.

EXAMPLES OF THE SOLAR MODULES

Example 1

A square solar module having an edge length of 2 m has a front pane which consists of lime natron silicate glass having a coefficient of expansion of 8.5·10$^{-6}$ 1/K. The thickness of the front pane is 0.9 mm. The sum of the thicknesses of the intermediate layers including the cells is 1.3 mm. The back pane also consists of lime natron silicate glass having a coefficient of expansion of 8.5·10$^{-6}$ 1/K and is thermally pretensioned with a flexural strength of at least 90 MPa. Its thickness is chosen to be 4.5 mm.

Example 2

A rectangular solar module having an edge length of 2.5 m and 1.5 m has a front pane which consists of borosilicate glass having a coefficient of expansion of $4.5 \cdot 10^{-6}$ 1/K. The thickness of the front pane is 0.7 mm. For improving impact strength on both sides of the front pane burling in a hexagonal arrangement with a height of 0.15 mm and a density of 20 $cm^{-2}$ is rolled in. The sum of the thicknesses of the intermediate layers including the cells is 1.4 mm. The back pane also consists of borosilicate glass having a coefficient of expansion of $4.5 \cdot 10^{-6}$ 1/K and is thermally pre-tensioned with a flexural strength of at least 90 MPa and has a thickness of 5 mm.

Example 3

A square solar module having an edge length of 2 m has a front pane which consists of lime natron silicate glass having a coefficient of expansion of $8.5 \cdot 10^{-6}$ 1/K. The thickness of the front pane is 0.9 mm. The sum of the thicknesses of the intermediate layers including the cells is 1.3 mm. The back pane consists of lime natron silicate glass having a coefficient of expansion of $8.5 \cdot 10^{-6}$ 1/K and has wavy structure with a rising height of 1 mm and a height density of 5 $cm^{-2}$ in hexagonal arrangement by gravity depressions for improving flexural rigidity. The back pane is thermally pre-tensioned with a flexural strength of at least 90 MPa and has a thickness of 4 mm.

Example 4

A rectangular solar module having an edge length of 2.5 m and 1.5 m has a front pane which consists of borosilicate glass having a coefficient of expansion of $4.5 \cdot 10^{-6}$ 1/K and a thickness of 0.7 mm. For improving impact strength on both sides of the front pane burling in a hexagonal arrangement with a height of 0.15 mm and a density of 20 $cm^{-2}$ is rolled in. The sum of the thicknesses of the intermediate layers including the cells is 1.4 mm. The back pane consists of lime natron silicate glass having a coefficient of expansion of $8.5 \cdot 10^{-6}$ 1/K and has wavy structure with a rising height of 1 mm and a height density of 4 $cm^{-2}$ in hexagonal arrangement for increasing flexural rigidity. The back pane is thermally pre-tensioned so that a flexural strength of at least 90 MPa is achieved. The thickness is 4 mm.

| PARTS LIST | |
|---|---|
| 1 | Solar module |
| 2 | Front pane |
| 3 | Back pane |
| 4 | Intermediate layer |
| 5 | Embedment material layer |
| 6 | Embedment material layer |
| 7 | Solar cells |
| 8 | Pane |
| 9 | Burling |

While the invention has been illustrated and described as embodied in photovoltaic modules having reduced weight, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A solar module having a front pane (2) and a back pane (3), wherein one of said front pane and said back pane has a thickness of at least 3 mm±8% and another of said front pane and said back pane has a thickness of at most 2 mm±8 %;
    wherein said one of said front pane and said back pane that has said thickness of at least 3 mm±8% has a higher coefficient of thermal expansion than said another of said front pane and said back pane that has a thickness of at most 2 mm±8%.

2. The solar module as defined in claim 1, wherein said thickness of said another of said front pane and said back pane is at least 0.3 mm±8%.

3. The solar module as defined in claim 1, wherein the front pane (2) is thinner than the back pane (3).

4. The solar module as defined in claim 1, wherein said one of said front pane and said back pane that has said thickness of at least 3 mm±8% has a coefficient of thermal expansion that is $3*10^{-6} K^{-1}$ higher than that of said another of said front pane and said back pane that has a thickness of at most 2 mm °8%.

5. The solar module as defined in claim 1 wherein at least one of the front pane and the back pane has burling (9) on at least one side thereof.

6. The solar module as defined in claim 5, wherein the burling (9) has a height of at least 0.03 mm.

7. The solar module as defined in claim 5, wherein the burling (9) has a height of at most 0.5 mm.

8. The solar module as defined in claim 5, wherein the burling (9) is provided in a hexagonal arrangement.

9. The solar module as defined in claim 5, wherein the burling (9) has a density of at least 4 $cm^{-2}$.

10. The solar module as defined in claim 1, wherein at least one of the front pane and the back pane has a wavy structure.

11. The solar module as defined in claim 10, wherein the wavy structure has a rising height ($t_W$) of at least 0.3 mm.

12. The solar module as defined in claim 1, wherein a thicker one of the front pane and the back pane is manufactured from sodium silicate glass.

13. The solar module as defined in claim 1, wherein a thinner one of the front pane and the back pane is manufactured from borosilicate glass or lithium aluminium silicate glass.

* * * * *